(12) United States Patent
Liao et al.

(10) Patent No.: US 10,856,414 B2
(45) Date of Patent: Dec. 1, 2020

(54) SYSTEM AND METHOD FOR MINIMIZING CONNECTOR PAD OPEN-CIRCUIT STUBS

(71) Applicant: DELL PRODUCTS, LP, Round Rock, TX (US)

(72) Inventors: Chun-Lin Liao, Taipei (TW); Ching-Huei Chen, Pingtun (TW); Bhyrav M. Mutnury, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/918,491

(22) Filed: Mar. 12, 2018

(65) Prior Publication Data

US 2019/0281698 A1 Sep. 12, 2019

(51) Int. Cl.
| | | |
|---|---|---|
| H05K 1/11 | (2006.01) | |
| H05K 3/34 | (2006.01) | |
| H05K 1/02 | (2006.01) | |
| H05K 3/40 | (2006.01) | |
| H05K 1/18 | (2006.01) | |

(52) U.S. Cl.
CPC ............. H05K 1/111 (2013.01); H05K 1/024 (2013.01); H05K 1/0243 (2013.01); H05K 1/181 (2013.01); H05K 3/3421 (2013.01); H05K 3/4007 (2013.01); *H05K 2201/10628* (2013.01); *H05K 2201/10757* (2013.01)

(58) Field of Classification Search
CPC ...... H05K 1/024; H05K 1/111; H05K 1/0243; H05K 1/181; H05K 3/3421; H05K 3/4007

USPC ......................................................... 361/767
See application file for complete search history.

(56) References Cited

U.S. PATENT DOCUMENTS

| | | | |
|---|---|---|---|
| 7,155,821 B1 | 1/2007 | Downes et al. | |
| 8,118,611 B2 | 2/2012 | Jeon | |
| 2005/0167850 A1* | 8/2005 | Moden | H01L 21/485 257/778 |
| 2009/0086431 A1* | 4/2009 | Sakamoto | H05K 7/20009 361/695 |
| 2010/0064180 A1 | 3/2010 | Farkas et al. | |
| 2010/0314751 A1* | 12/2010 | Sheats | H01L 24/11 257/734 |
| 2013/0102187 A1 | 4/2013 | Camelio et al. | |
| 2014/0063767 A1* | 3/2014 | Saitou | H01L 23/3735 361/783 |
| 2016/0323995 A1 | 11/2016 | Yi et al. | |
| 2017/0301653 A1* | 10/2017 | Frenette | H01L 23/66 |

\* cited by examiner

*Primary Examiner* — Tremesha S Willis
(74) *Attorney, Agent, or Firm* — Larson Newman, LLP

(57) ABSTRACT

A printed circuit board includes a circuit trace and a connector pad. The connector pad provides electrical and mechanical mounting of a connector lead of a surface mount device and provides a circuit path between the surface mount device and the circuit trace. The connector pad includes 1) a connector pad base electrically coupled to the circuit trace, and 2) a first connector pad island electrically isolated from the connector pad base. The connector pad base has a length that is substantially equal to a length of a contact portion of the connector lead.

20 Claims, 5 Drawing Sheets

A

B

A

B

A

B

SYSTEM AND METHOD FOR MINIMIZING CONNECTOR PAD OPEN-CIRCUIT STUBS

FIELD OF THE DISCLOSURE

This disclosure generally relates to information handling systems, and more particularly relates to minimizing connector pad open-circuit stubs.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A printed circuit board may include a circuit trace and a connector pad. The connector pad can provide electrical and mechanical mounting of a connector lead of a surface mount device. The connector pad can also provide a circuit path between the surface mount device and the circuit trace. The connector pad may include 1) a connector pad base electrically coupled to the circuit trace, and 2) a first connector pad island electrically isolated from the connector pad base. The connector pad base may have a length that is substantially equal to a length of a contact portion of the connector lead.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
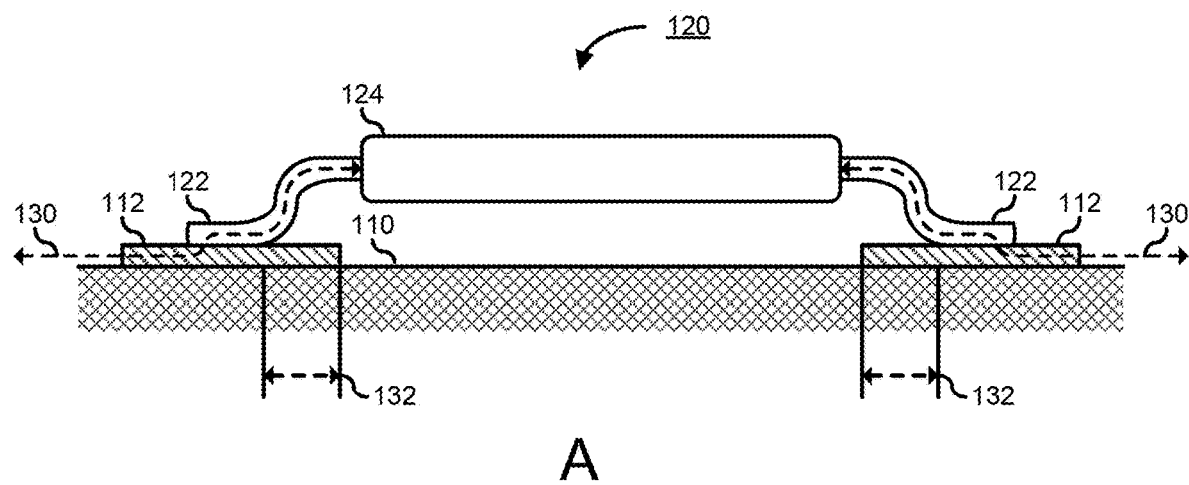
FIG. 1 is a schematic of a surface mount device mounted to a printed circuit board (PCB) in accordance with the prior art.
Figure 1:
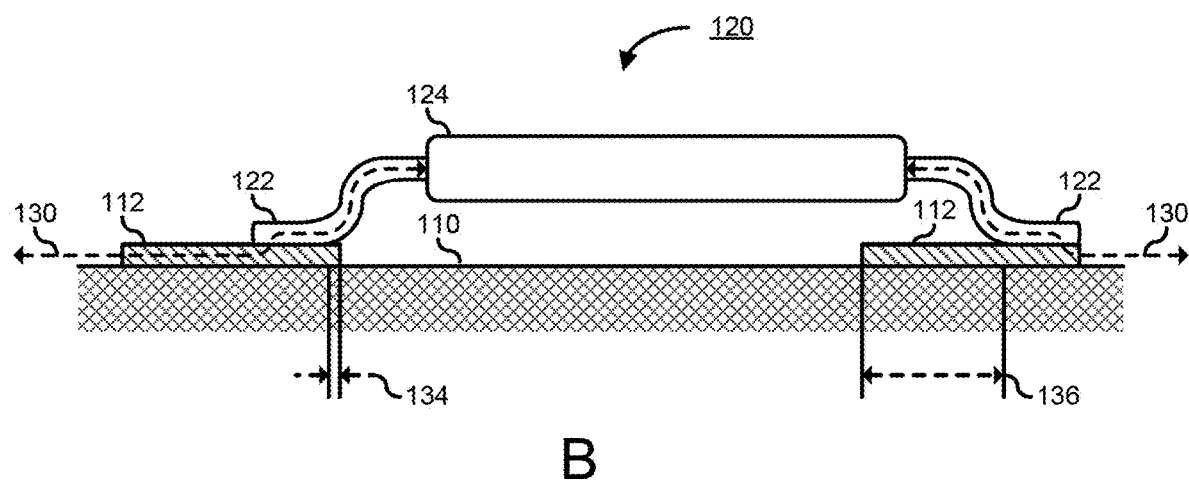

FIG. 1 illustrates a surface mount device (SMD) 120 mounted to a printed circuit board (PCB) 110, as is known in the art. SMD 120 includes connector leads 122 and a device 124. Device 124 represents a wide variety of electrical and electronic components that are available in surface mount packages as are known in the art. For example, device 124 can represent a discrete device or group of passive devices, such as capacitors, resistors, inductors, discrete transistors and the like that can be packaged as surface mount devices. In another example, device 124 can represent an integrated circuit device that can be packaged as a surface mount device. Connector leads 122 operate to provide a mechanical attachment to PCB 110. Connector leads 122 are placed such that a contact portion of the connector leads are place atop connector pads 112 that are provided on the surface of the PCB, and then being soldered to the connector pads, firmly attaching SMD 120 to the PCB. Connector leads 122 also operate to provide electrical connection between PCB 110 and device 124. Here, connector pads 112 are connected to various circuit traces of PCB 110, and connector leads 122 are connected to device 124 via their soldered contact portions to provide the various circuit paths for performing the processing tasks associated with the PCB. As such, connector pads 112 and connector leads 122 are shown as providing respective circuit paths 130. Connector pads 112 are deliberately sized larger than the actual size needed to make the mechanical and electrical connections necessary for secure attachment and signal transmission. This is because in a typical manufacturing process, there is some tolerance provided for how accurately SMD 120 is placed and attached to PCB 110. Thus, as shown in the top illustration A of FIG. 1, SMD 120 is optimally placed upon PCB 110, with connector leads 122 centered on connector pads 112. However, even if SMD 120 is placed slightly askew, such as is shown in the bottom illustration B of FIG. 1, SMD 120 still retains sufficient mechanical and electrical contact to connector pads 112 via connector leads 122 as to retain mechanical and electrical contact between PCB 110 and device 124.

Where the circuits associated with circuit paths 130 are high speed circuits, the signals carried by the circuit paths may operate at very high frequencies. In such cases, any length of connector pads 112 that is beyond the point of contact between the connector pads and connector leads 122 are not actually utilized in carrying the electrical signals of circuit paths 130, but instead act as open-circuit stubs that resonate at a characteristic frequency that is determined by the length of the stub. When SMD 120 is placed as shown in the top illustration A of FIG. 1, the excess length of circuit pads 112 provide for similar lengths of open-circuit stubs 132. However, when SMD 120 is placed as shown in the bottom illustration B of FIG. 1, one side will exhibit a short open-circuit stub 134 and the other side will exhibit a long open-circuit stub 136. Not that in both the cases of illustration A and illustration B, SMD 120 is deemed to be correctly placed on PCB 110. That is, both placements are to be considered as being within the normal process variation for PCB manufacturing processes, and illustration B should not be considered misaligned.

The resonate frequency of an open-circuit stub can be expressed as:

$$f_{res} = \frac{C_0}{4\sqrt{\varepsilon_{eff}}\, L_{stub}} \qquad \text{Equation 1}$$

where $f_{res}$ is the resonate frequency in mega-Hertz (MHz), co is the speed of a wave in free space (3.0×10⁸ meters per second (m/s)), $\varepsilon_{eff}$ is the effective dielectric constant of the PCB, and $L_{stub}$ is the length of the open-circuit stub. Thus it will be understood that a longer stub will resonate (i.e., radiate signal energy) at a lower resonate frequency, and a shorter stub will resonate at a higher resonate frequency. In a typical PCB such as PCB 110, the circuit traces that are coupled to connector pads 112 are on the surface of the PCB. Thus the wave propagates half in air and half in the PCB material. The dielectric constant of free air $\varepsilon_{r\text{-}air}$ is equal to 1, and the dielectric constant of the PCB material $\varepsilon_r$. PCB is typically equal to 4. Thus the effective dielectric constant ($\varepsilon_{eff}$) is typically equal to 2.5 (=(1+4)/2). Based upon Equation 1, the resonate frequencies for various open-circuit stub lengths are shown in Table 1.

TABLE 1

Resonate Frequency vs. Stub Length

| $L_{stub}$ (mils) | $\varepsilon_{eff}= 4$ $f_{res}$ (GHZ) | $\varepsilon_{eff}= 2.5$ $f_{res}$ (GHZ) | $\varepsilon_{eff}= 2$ $f_{res}$ (GHZ) |
|---|---|---|---|
| 10 | 147.6 | 186.7 | 208.8 |
| 20 | 73.8 | 93.4 | 104.4 |
| 30 | 49.2 | 62.2 | 69.6 |
| 40 | 36.9 | 46.7 | 52.2 |
| 50 | 29.5 | 37.3 | 41.8 |
| 60 | 24.6 | 31.1 | 34.8 |
| 70 | 21.1 | 26.7 | 29.8 |
| 80 | 18.5 | 23.3 | 26.1 |
| 90 | 16.4 | 20.7 | 23.2 |
| 100 | 14.8 | 18.7 | 20.9 |

Figure 2:
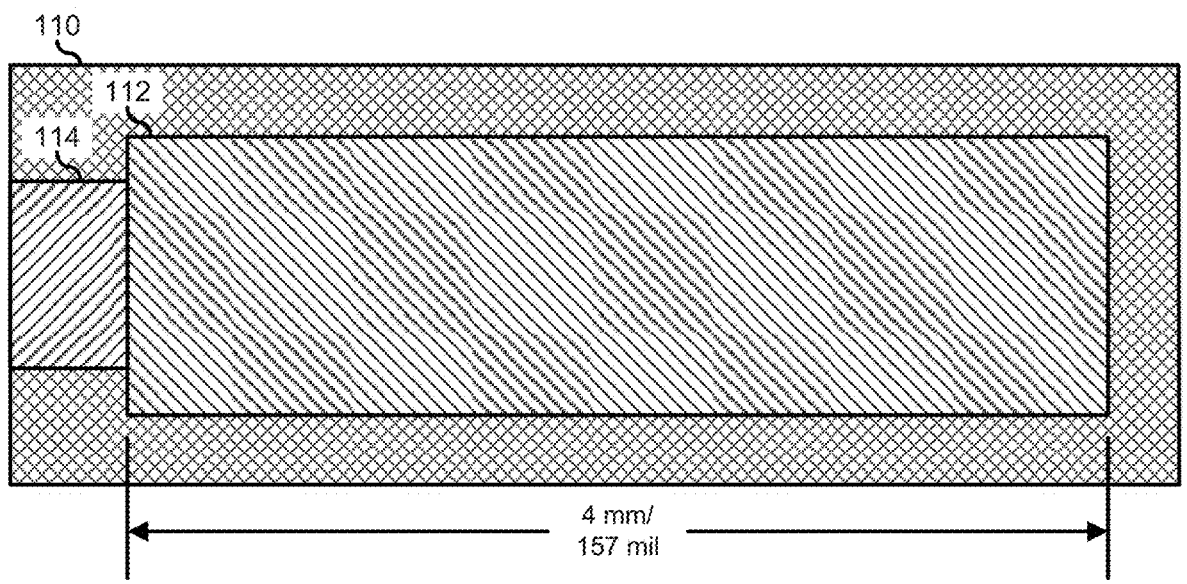
FIG. 2 is a top view of a connector pad of the PCB of FIG. 1.

FIG. 2 is a top view of connector pad 112 with an associated circuit trace 114 on PCB 110. Connector pad 112 has an overall length of 4 millimeters (mm), or 157 mils. When SMD 120 is nominally placed, open-circuit stubs 132 are typically around 70 mils (0.76 mm), but when the SMD is placed as shown in illustration B, open-circuit stub 134 can be as short as 10 mils (0.25 mm), and open-circuit stub 136 can be as long as 50 mils (1.27 mm). As such, the resonate frequency can vary between 37.3-186.7 GHz. These resonate frequencies are higher than the Nyquist frequency of current and future generation serial data interfaces. For example, PCIe gen 4 has a maximum data rate of 16 giga-bits per second (16 G bps) and a Nyquist frequency of 8 GHz, while PCIe gen 5 has a maximum data rate of 72 G bps and a Nyquist frequency of 16 GHz. Thus, even for the longest of stub lengths, and the resonate frequency of an open-circuit stub on a typical PCB ($\varepsilon_{eff}=2.5$) is greater than the Nyquist frequency of present and near future serial data interfaces.

Figure 3:
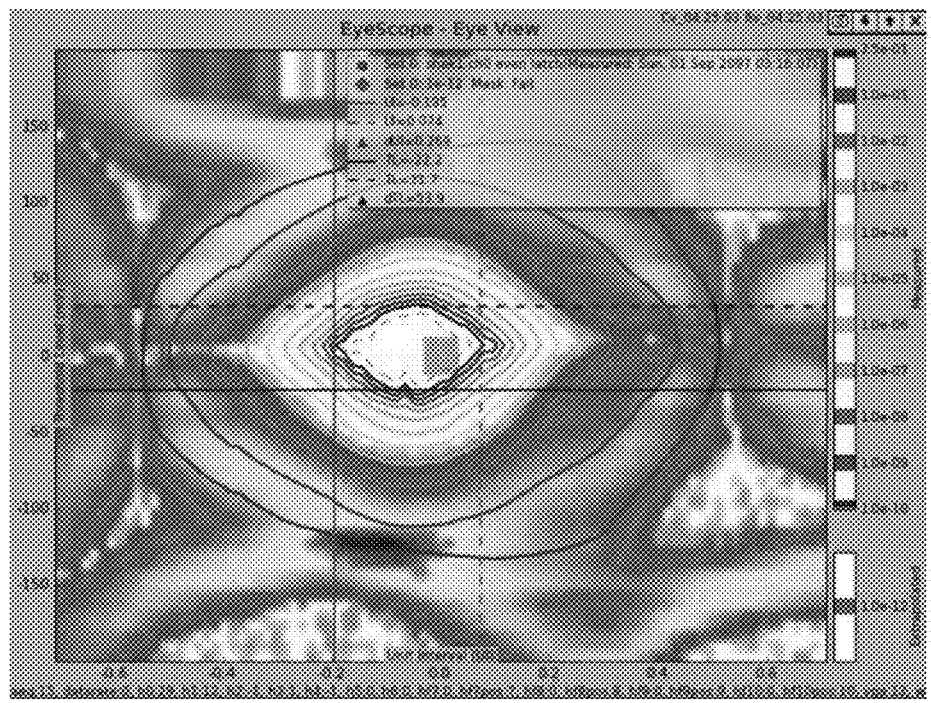
FIG. 3 is a signal trace of a signal eye diagram for a data channel of a serial data interface of the PCB of FIG. 1.

However, even though the resonate frequencies of open-circuit stubs formed in the manufacture of surface mount devices on PCBs are typically greater than the Nyquist frequencies of present and near future serial data interfaces, the performance of a serial data interface is generally improved when the resonate frequency of the open-circuit stubs is still further above the Nyquist frequency. For example, FIG. 3 illustrates a trace of a signal eye diagram for a data channel of a serial data interface. The illustration shows a poor quality signal eye diagram for the data channel that includes an SMD that is attached to a PCB with an open-circuit stub with a longer stub length, such as might be provided by a less than optimally placed SMD, such as for a data channel with a 50 mil stub.

Figure 4:
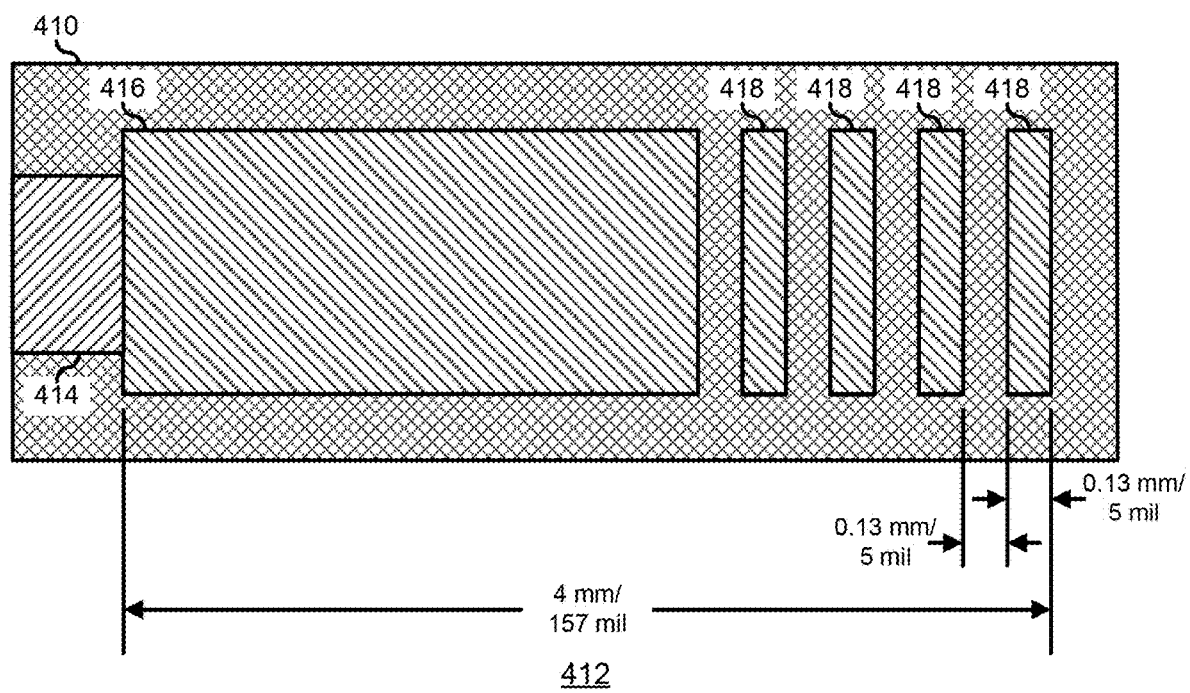
FIG. 4 is a top view of a connector pad according to an embodiment of the present disclosure.

FIG. 4 is a top view of a connector pad 412 with an associated circuit trace 414 on a PCB 410 according to an embodiment of the present disclosure. Connector pad 412 is similar to connector pad 112, having an overall length of 4 millimeters (mm), or 157 mils. However, connector pad 412 differs from connector pad 112 in that connector pad 412 includes a connector pad base 416 and one or more connector pad islands 418. Connector pad portion 416 and connector pad islands 418 are electrically isolated from each other. In particular, in patterning the surface of PCB 410 with connector pad 412, the metal trace material of circuit trace 414 is formed continuously with the metal trace material of connector pad base 416, and each of connector pad islands 418 are formed as separate and isolated metalization on the surface of the PCB. In a particular embodiment, connector pad islands 418 are 7-8 mils wide and are spaced 7-8 mils apart. Generally, length and distance between connector pad islands 418 will be provided based upon the manufacturing tolerances of PCB 410. In particular, the dimensions of connector pad islands 418 and the distances there between will be dictated by the ability of solder to be applied to the surface of PCB 410 and to remain soldered to the connector pad islands without forming solder bridges between the connector pad islands.

Figure 5:
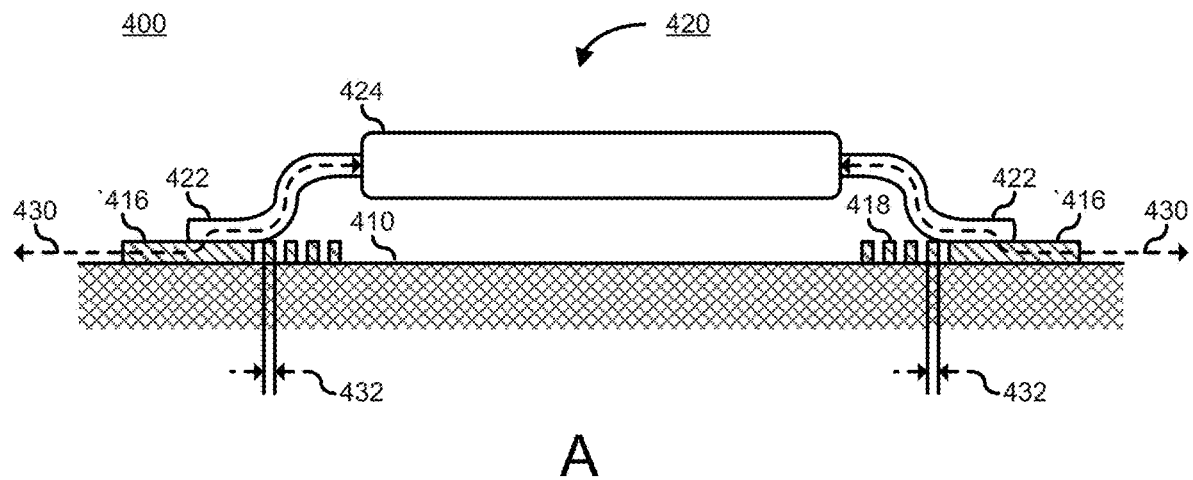
FIG. 5 is a schematic view of a surface mount device mounted to a PCB using the connector pad of FIG. 4.
Figure 5:
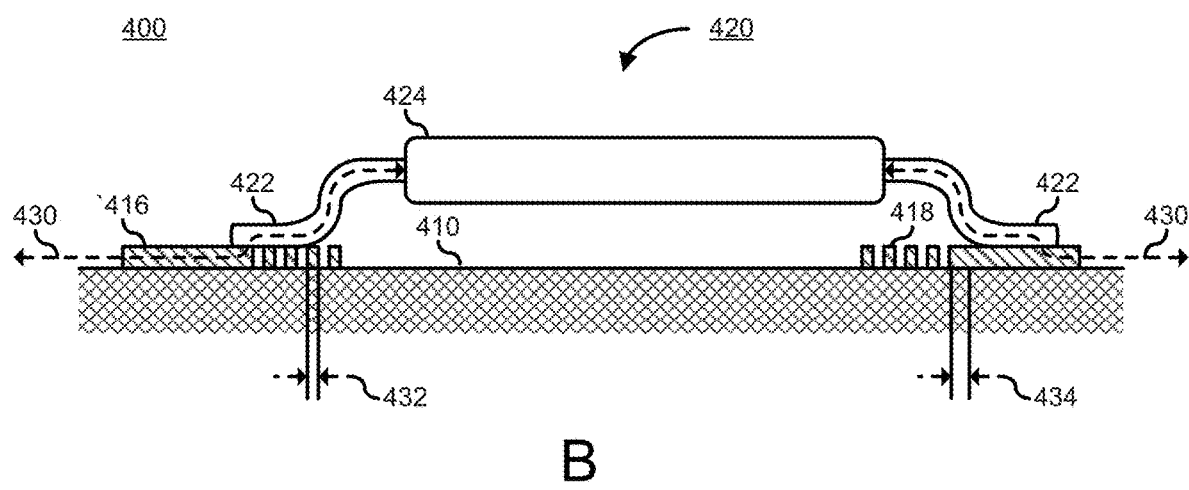

FIG. 5 illustrates a surface mount device (SMD) 420 mounted to PCB 410. SMD 420 includes connector leads 422 and a device 424. Device 424 is similar to device 124. Connector leads 422 are similar to connector leads 122, providing mechanical and electrical attachment to PCB 410. Connector pads 412 (shown in this view by connector pad bases 416 and connector pad islands 418, and connector leads 422 are shown as providing respective circuit paths 430. Connector pads 412 are deliberately sized larger than the actual size needed to make the mechanical and electrical connections necessary for secure attachment and signal transmission to account for manufacturing process tolerances. Thus, as shown in the top illustration A of FIG. 5, SMD 420 is optimally placed upon PCB 410, with connector leads 422 centered on connector pads 142. Further, as is shown in the bottom illustration B of FIG. 5, SMD 420 still retains sufficient mechanical and electrical contact to connector pads 412 via connector leads 422 as to retain mechanical and electrical contact between PCB 410 and device 424 when SMD is placed slightly askew on the PCB.

When SMD 420 is mounted to PCB 400, some portion of connector leads 422 may bridge between connector pad bases 416 and connector pad islands 418. For example, in the top illustration A, both of connector leads 422 are bridge between their respective connector pad base 416 and a single connector pad island 418. Similarly, in the bottom illustration B, connector lead 422 on the left side bridges between the associated connector pad base 422 and three (3) of connector pad islands 418. Then, when SMD 420 is soldered to PCB 400, the solder reflows between connector pad bases 416 and the bridged connector pad islands 418, making a continuous circuit path for circuit paths 430. On the other hand, if connector lead 422 is not bridged to a particular connector pad island 418, then any solder that is placed atop the unbridged connector pad islands and that is placed in the spaces between the unbridged connector pads will reflow to the connector pads and will not provide an electrical short between the unbridged connector pad islands.

Figure 6:
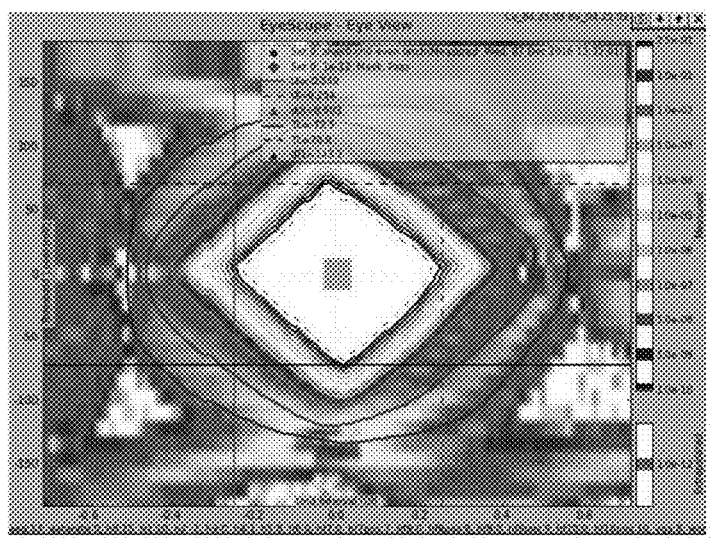
FIG. 6 is a signal trace of a signal eye diagram for a data channel of a serial data interface of the PCB of FIG. 5.

In this way, the open-circuit stubs 432 that are minimized by the length of a single connector pad island 418 and the spacing between the connector pad islands. For example, in a worst case, where connector pad islands 418 are 8 mils wide, and are spaced 8 mils apart, then open-circuit stub 432 will not exceed 16 mils, and the resonate frequency may be expected to be 149.4 GHz, far beyond the Nyquist frequency of current and future generation serial data interfaces. Note that even when connector lead 422 is located completely atop connector pad base 422, as shown in the right side of illustration B, the open-circuit stub 434 that is formed at the end of the connector pad base is far shorter than the similarly placed connector lead as depicted in FIG. 1. The length of such a case will be dictated by the particular geometry of the connector leads and connector pads, the manufacturing placement tolerances, and the like, and so specific calculation of the length of open-circuit stub 434 is not necessary. It is sufficient to note that in any case, utilizing connector pad 412 will result in shorter open-circuit stubs and hence will relegate any radiated energy from circuits that utilize connector pad 412 to such a high frequency as to not negatively impact the signal integrity of the associated circuits. FIG. 6 is a trace of a signal eye diagram for a data channel of a serial data interface that utilizes connector pad 412. The illustration shows a better quality signal eye diagram for the data channel than for the similar data channel as shown in FIG. 3.

Figure 7:
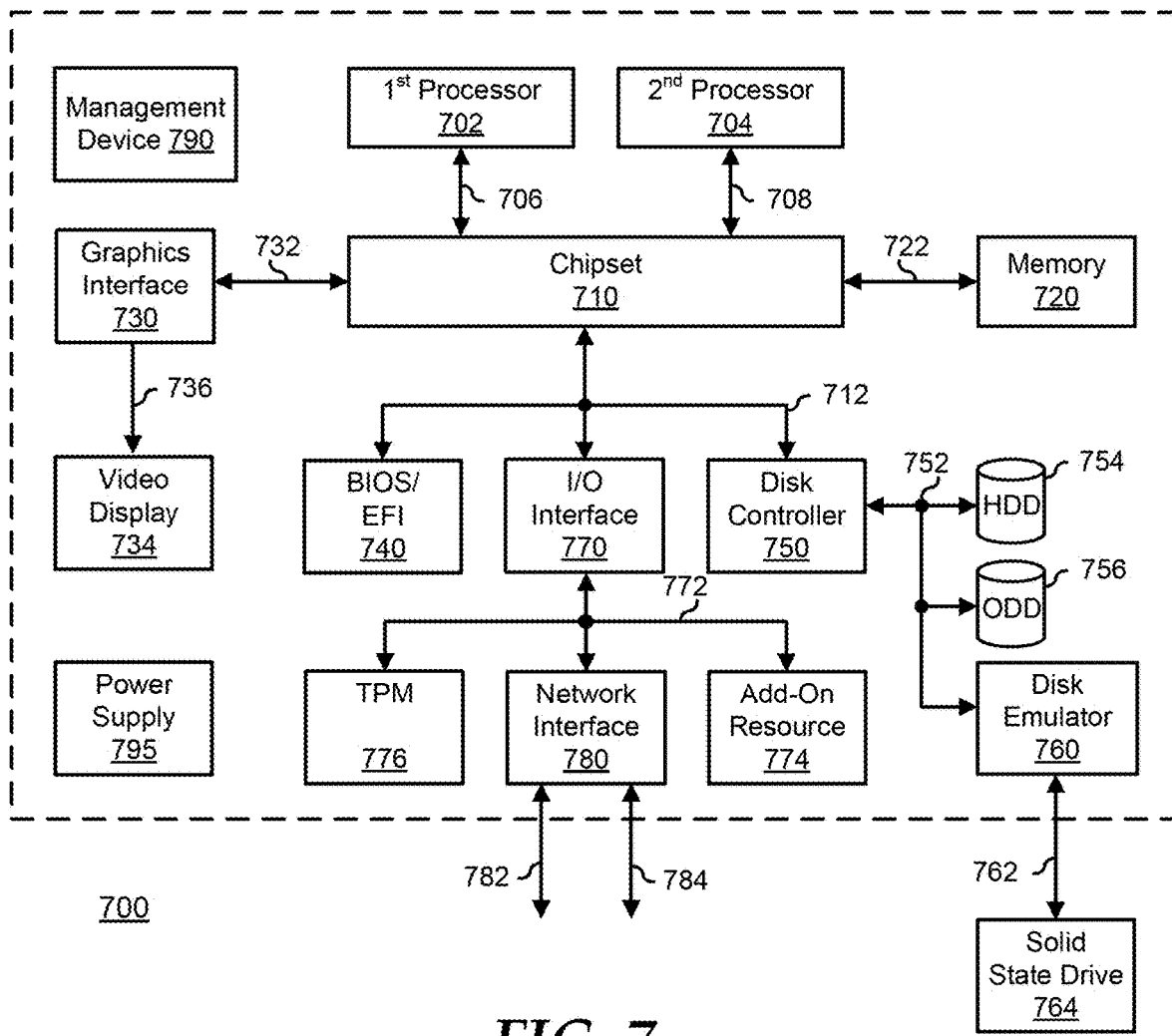
FIG. 7 is a block diagram illustrating a generalized information handling system according to an embodiment of the present disclosure.

FIG. 7 illustrates a generalized embodiment of an information handling system 700 similar to information handling system 100. For purpose of this disclosure information handling system 700 can be configured to provide the features and to perform the functions of the OPF system as described herein. Information handling system 700 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 700 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 700 can include processing resources for executing machine-executable code, such as a central processing unit (CPU), a programmable logic array (PLA), an embedded device such as a System-on-a-Chip (SoC), or other control logic hardware. Information handling system 700 can also include one or more computer-readable medium for storing machine-executable code, such as software or data. Additional components of information handling system 700 can include one or more storage devices that can store machine-executable code, one or more communications ports for communicating with external devices, and various input and output (I/O) devices, such as a keyboard, a mouse, and a video display. Information handling system 700 can also include one or more buses operable to transmit information between the various hardware components.

Information handling system 700 can include devices or modules that embody one or more of the devices or modules described below, and operates to perform one or more of the methods described below. Information handling system 700 includes a processors 702 and 704, a chipset 710, a memory 720, a graphics interface 730, a basic input and output system/universal extensible firmware interface (BIOS/UEFI) module 740, a disk controller 750, a hard disk drive (HDD) 754, an optical disk drive (ODD) 756, a disk emulator 760 connected to an external solid state drive (SSD) 762, an input/output (I/O) interface 770, one or more add-on resources 774, a trusted platform module (TPM) 776, a network interface 780, a management device 790, and a power supply 795. Processors 702 and 704, chipset 710, memory 720, graphics interface 730, BIOS/UEFI module 740, disk controller 750, HDD 754, ODD 756, disk emulator 760, SSD 762, I/O interface 770, add-on resources 774, TPM 776, and network interface 780 operate together to provide a host environment of information handling system 700 that operates to provide the data processing functionality of the information handling system. The host environment operates to execute machine-executable code, including platform BIOS/UEFI code, device firmware, operating system code, applications, programs, and the like, to perform the data processing tasks associated with information handling system 700.

In the host environment, processor 702 is connected to chipset 710 via processor interface 706, and processor 704 is connected to the chipset via processor interface 708. Memory 720 is connected to chipset 710 via a memory bus 722. Graphics interface 730 is connected to chipset 710 via a graphics interface 732, and provides a video display output 736 to a video display 734. In a particular embodiment, information handling system 700 includes separate memories that are dedicated to each of processors 702 and 704 via separate memory interfaces. An example of memory 720 includes random access memory (RAM) such as static RAM (SRAM), dynamic RAM (DRAM), non-volatile RAM (NV-RAM), or the like, read only memory (ROM), another type of memory, or a combination thereof.

BIOS/UEFI module 740, disk controller 750, and I/O interface 770 are connected to chipset 710 via an I/O channel 712. An example of I/O channel 712 includes a Peripheral Component Interconnect (PCI) interface, a PCI-Extended (PCI-X) interface, a high speed PCI-Express (PCIe) interface, another industry standard or proprietary communication interface, or a combination thereof. Chipset 710 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 740 includes BIOS/UEFI code operable to detect resources within information handling system 700, to provide drivers for the resources, initialize the resources, and access the resources. BIOS/UEFI module 740 includes code that operates to detect resources within information handling system 700, to provide drivers for the resources, to initialize the resources, and to access the resources.

Disk controller 750 includes a disk interface 752 that connects the disk controller to HDD 754, to ODD 756, and to disk emulator 760. An example of disk interface 752 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 760 permits SSD 764 to be connected to information handling system 700 via an external interface 762. An example of external interface 762 includes a USB interface, an IEEE 1394 (Firewire) interface, a proprietary interface, or a combination thereof. Alternatively, solid-state drive 764 can be disposed within information handling system 700.

I/O interface 770 includes a peripheral interface 772 that connects the I/O interface to add-on resource 774, to TPM 776, and to network interface 780. Peripheral interface 772 can be the same type of interface as I/O channel 712, or can be a different type of interface. As such, I/O interface 770 extends the capacity of I/O channel 712 when peripheral interface 772 and the I/O channel are of the same type, and the I/O interface translates information from a format suitable to the I/O channel to a format suitable to the peripheral channel 772 when they are of a different type. Add-on resource 774 can include a data storage system, an additional graphics interface, a network interface card (NIC), a sound/video processing card, another add-on resource, or a combination thereof. Add-on resource 774 can be on a main circuit board, on separate circuit board or add-in card disposed within information handling system 700, a device that is external to the information handling system, or a combination thereof.

Network interface 780 represents a NIC disposed within information handling system 700, on a main circuit board of the information handling system, integrated onto another component such as chipset 710, in another suitable location, or a combination thereof. Network interface device 780 includes network channels 782 and 784 that provide interfaces to devices that are external to information handling system 700. In a particular embodiment, network channels 782 and 784 are of a different type than peripheral channel 772 and network interface 780 translates information from a format suitable to the peripheral channel to a format suitable to external devices. An example of network channels 782 and 784 includes InfiniBand channels, Fibre Channel channels, Gigabit Ethernet channels, proprietary channel architectures, or a combination thereof. Network channels 782 and 784 can be connected to external network resources (not illustrated). The network resource can include another information handling system, a data storage system, another network, a grid management system, another suitable resource, or a combination thereof.

Management device 790 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 700. In particular, management device 790 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 700, such as system cooling fans and power supplies. Management device 790 can include a network connection to an external management system, and the management device can communicate with the management system to report status information for information handling system 700, to receive BIOS/UEFI or system firmware updates, or to perform other task for managing and controlling the operation of information handling system 700. Management device 790 can operate off of a separate power plane from the components of the host environment so that the management device receives power to manage information handling system 700 when the information handling system is otherwise shut down. An example of management device 790 may include a commercially available BMC product that operates in accordance with an Intelligent Platform Management Initiative (IPMI) specification, such as a Integrated Dell Remote Access Controller (iDRAC), or the like. Management device 790 may further include associated memory devices, logic devices, security devices, or the like, as needed or desired.

Power supply 795 represents one or more devices for power distribution to the components of information handling system 700. In particular, power supply 795 can include a main power supply that receives power from an input power source, such as a wall power outlet, a power strip, a battery, or another power source, as needed or desired. Here, power source 795 operates to convert the power at a first voltage level from the input power source to one or more power rails that are utilized by the components of information handling system. Power supply 795 can also include one or more voltage regulators (VRs) that each receive power from the main power supply and that operate to convert the input voltage to an output voltage that is used by one or more components of information handling system. For example, a VR can be provided for each of processors 702 and 704, and another VR can be provided for memory 720. Power supply 795 can be configured to provide a first power plane that provides power to the host environment, and to provide a second power plane that provides power to the management environment.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A printed circuit board, comprising:
   a circuit trace; and a connector pad having a connector pad length and configured to provide electrical and mechanical mounting of a rigid connector lead of a surface mount device and to provide a circuit path between the surface mount device and the circuit trace, the connector pad including 1) a connector pad base having a first length and electrically coupled to the circuit trace, and 2) a first connector pad island having a second length, wherein the first connector pad island is separated from the connector pad base by a first gap, and wherein the first connector pad island is electrically isolated from the connector pad base, wherein the connector pad base has a length that is substantially equal to a length of a contact portion of the connector lead, and wherein the second length is substantially shorter than the first length.

2. The printed circuit board of claim 1, wherein the connector pad further includes a second connector pad island having a third length, wherein the second connector pad island is separated from the first connector pad island by a second gap, and wherein the second connector pad island is electrically isolated from the connector pad base and from the first connector pad island, and wherein the third length is substantially equal to the second length.

3. The printed circuit board of claim 2, wherein, when the contact portion of the connector lead is placed and soldered to the connector pad such that the contact portion is only atop the connector pad base, the first and second connector pad islands remain electrically isolated from the connector pad base.

4. The printed circuit board of claim 3, wherein, when the contact portion of the connector lead is placed and soldered to the connector pad such that the contact portion bridges between the connector pad base and the first connector pad island, the connector pad base and the first connector pad island become electrically shorted together, and the second connector pad island remains electrically isolated from the first connector pad island.

5. The printed circuit board of claim 4, wherein, when the contact portion of the connector lead is placed and soldered to the connector pad such that the contact portion bridges between the connector pad base, the first connector pad island, and the second connector pad island, the connector pad base, the first connector pad island, and the second connector pad island become electrically shorted together.

6. The printed circuit board of claim 2, wherein the first connector pad island is spaced 3-8 mils from the connector pad base, and the second connector pad island is spaced 3-8 mils from the first connector pad island.

7. The printed circuit board of claim 6, wherein the first and second connector pad islands have lengths of 3-8 mils.

8. The printed circuit board of claim 1, wherein the printed circuit board has an effective dielectric constant of 2-4.

9. The printed circuit board of claim 1, wherein a tuned stub formed by the connector pad when the connector lead is mounted to the connector pad has a resonate frequency greater than 140 GHz.

10. A method of providing a connector pad on a printed circuit board, the connector pad for mounting a rigid connector lead of a surface mount device, the method comprising:
fabricating a circuit trace on the printed circuit board; and
fabricating the connector pad on the printed circuit board, the connector pad having a connector pad length and configured to provide electrical and mechanical mounting of the connector lead of the surface mount device and to provide a circuit path between the surface mount device and the circuit trace, wherein in fabricating the connector pad, the method further comprises:
fabricating a connector pad base having a first length, wherein the connector pad base is electrically coupled to the circuit trace, and wherein the connector pad base has a length that is substantially equal to a length of a contact portion of the connector lead; and
fabricating a first connector pad island having a second length, wherein the first connector pad island is separated from the connector pad base by a first gap, and wherein the connector pad island is electrically isolated from the connector pad base, and wherein the second length is substantially shorter than the first length.

11. The method of claim 10, wherein in fabricating the connector pad, the method further comprises:
fabricating a second connector pad island having a third length, wherein the second connector pad island is separated from the first connector pad island by a second gap, and wherein the second connector pad island is electrically isolated from the connector pad base and from the first connector pad island, and wherein the third length is substantially equal to the second length.

12. The method of claim 11, wherein, when the contact portion of the connector lead is placed and soldered to the connector pad such that the contact portion is only atop the connector pad base, the first and second connector pad islands remain electrically isolated from the connector pad base.

13. The method of claim 12, wherein, when the contact portion of the connector lead is placed and soldered to the connector pad such that the contact portion bridges between the connector pad base and the first connector pad island, the connector pad base and the first connector pad island become electrically shorted together, and the second connector pad island remains electrically isolated from the first connector pad island.

14. The method of claim 13, wherein, when the contact portion of the connector lead is placed and soldered to the connector pad such that the contact portion bridges between the connector pad base, the first connector pad island, and the second connector pad island, the connector pad base, the first connector pad island, and the second connector pad island become electrically shorted together.

15. The method of claim 11, wherein the first connector pad island is spaced 3-8 mils from the connector pad base, and the second connector pad island is spaced 3-8 mils from the first connector pad island.

16. The method of claim 15, wherein the first and second connector pad islands have lengths of 3-8 mils.

17. The method of claim 10, wherein the printed circuit board has an effective dielectric constant of 2-4.

18. The method of claim 10, wherein a tuned stub formed by the connector pad when the connector lead is mounted to the connector pad has a resonate frequency greater than 140 GHz.

19. An information handling system, comprising:
a surface mount device having a rigid connector lead, the connector lead including a contact portion; and
a printed circuit board, including:
a circuit trace; and
a connector pad having a connector pad length and configured to provide electrical and mechanical mounting of the connector lead and to provide a circuit path between the surface mount device and the circuit trace, the connector pad including 1) a connector pad base having a first length and electrically coupled to the circuit trace, 2) a first connector pad island having a second length, wherein the first connector pad island is separated from the connector pad base by a first gap, and wherein the connector pad island is electrically isolated from the connector pad base, and 3) a second connector pad island having a third length, wherein the second connector pad island is separated from the first connector pad island by a second gap, wherein the second connector pad island is electrically isolated from the connector pad base and from the first connector pad island, wherein the connector pad base has a length that is substantially equal to a length of a contact portion of the connector lead, wherein the second length is substantially shorter than the first length, and wherein the third length is substantially equal to the second length.

20. The information handling system of claim 19, wherein, when the contact portion of the connector lead is placed and soldered to the connector pad such that the contact portion is only atop the connector pad base, the first and second connector pad islands remain electrically isolated from the connector pad base, and when the contact portion of the connector lead is placed and soldered to the connector pad such that the contact portion bridges between the connector pad base and the first connector pad island, the connector pad base and the first connector pad island become electrically shorted together, and the second connector pad island remains electrically isolated from the first connector pad island.

* * * * *